US008841544B2

(12) United States Patent
Hong et al.

(10) Patent No.: US 8,841,544 B2
(45) Date of Patent: Sep. 23, 2014

(54) UNIFORMLY DISTRIBUTED SELF-ASSEMBLED SOLDER DOT FORMATION FOR HIGH EFFICIENCY SOLAR CELLS

(75) Inventors: Augustin J. Hong, White Plains, NY (US); Jeehwan Kim, Los Angeles, CA (US); Jae-Woong Nah, New York, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/611,047

(22) Filed: Sep. 12, 2012

(65) Prior Publication Data

US 2014/0060628 A1    Mar. 6, 2014

Related U.S. Application Data

(63) Continuation of application No. 13/597,980, filed on Aug. 29, 2012.

(51) Int. Cl.
*H01L 31/00* (2006.01)

(52) U.S. Cl.
USPC ....................................................... 136/255

(58) Field of Classification Search
USPC ....................................................... 136/255
See application file for complete search history.

(56) References Cited

U.S. PATENT DOCUMENTS

| 5,159,171 | A | 10/1992 | Cook et al. |
| 5,486,427 | A | 1/1996 | Koskenmaki et al. |
| 6,338,980 | B1 | 1/2002 | Satoh |
| 6,593,522 | B2 | 7/2003 | Nakano et al. |
| 6,605,772 | B2 | 8/2003 | Harman et al. |
| 6,806,141 | B2 | 10/2004 | Kamins |
| 7,227,066 | B1 | 6/2007 | Roscheisen et al. |
| 7,589,880 | B2 | 9/2009 | Kempa et al. |
| 7,634,162 | B2 | 12/2009 | Kempa et al. |
| 7,740,713 | B2 | 6/2010 | Duchesne et al. |
| 7,883,789 | B2 | 2/2011 | Sato et al. |
| 7,923,626 | B2 | 4/2011 | Blieske et al. |
| 7,964,499 | B2 | 6/2011 | Kim et al. |

(Continued)

FOREIGN PATENT DOCUMENTS

WO    2009082137    7/2009

OTHER PUBLICATIONS

Zhu et al., Optical Absorption Enhancement in Amorphous Silicon Nanowire and Nanocone Arrays, Nano Letters 9(1), 2009, 279-282.*
Hsu et al., Wafer-scale Silicon Nanopillars and Nanocones by Langmuir-Blodgetter Assembly and Etching, Applied Physics Letters 93, 133109 (2008).*

(Continued)

*Primary Examiner* — Jonathan Johnson
*Assistant Examiner* — Angelo Trivisonno
(74) *Attorney, Agent, or Firm* — Tutunjian & Bitetto, P.C.; Louis J. Percello

(57) ABSTRACT

A substrate for photovoltaic device includes a textured surface formed from silicon-based material. The textured surface includes a plurality of cones uniformly distributed across the textured surface. The uniformly distributed cones are configured by etching from a top surface of the substrate using a self-assembled solder dot mask evaporated on the substrate prior to etching. The cones are uniformly distributed as a result of gettering a process chamber prior to forming the solder dot mask. The cones have a height/width ratio between about 1 to about 4, and the cones have a density between $10^8$ to $10^9$ cones/cm$^2$.

14 Claims, 6 Drawing Sheets

(56) References Cited

U.S. PATENT DOCUMENTS

| | | |
|---|---|---|
| 8,105,860 B2 | 1/2012 | Amiotti |
| 2003/0005956 A1* | 1/2003 | Hirata et al. ............ 136/256 |
| 2004/0149330 A1 | 8/2004 | Sugiyama et al. |
| 2007/0047056 A1 | 3/2007 | Kempa et al. |
| 2007/0137697 A1 | 6/2007 | Kempa et al. |
| 2007/0176288 A1 | 8/2007 | Daubenspeck et al. |
| 2009/0194160 A1 | 8/2009 | Chin et al. |
| 2009/0274873 A1 | 11/2009 | Shinotsuka |
| 2009/0296189 A1 | 12/2009 | Black et al. |
| 2010/0071760 A1 | 3/2010 | Kwok et al. |
| 2010/0139771 A1 | 6/2010 | Schwede et al. |
| 2010/0240167 A1* | 9/2010 | Dasgupta et al. ............ 438/63 |
| 2010/0258163 A1 | 10/2010 | Zheng et al. |
| 2010/0260977 A1* | 10/2010 | Singh et al. ............ 428/172 |
| 2010/0288329 A1 | 11/2010 | Hong et al. |
| 2010/0319758 A1* | 12/2010 | Ikuno ............ 136/252 |
| 2011/0121431 A1* | 5/2011 | Cui et al. ............ 257/618 |
| 2011/0277827 A1* | 11/2011 | Yang et al. ............ 136/255 |
| 2011/0284061 A1 | 11/2011 | Vanecek et al. |
| 2012/0031454 A1 | 2/2012 | Fogel et al. |
| 2012/0060905 A1 | 3/2012 | Fogel et al. |

OTHER PUBLICATIONS

Hong, A., et al. (Formation of Metal Nanospheres and Microspheres) Final Office Action for U.S. Appl. No. 13/606,916 mailed on Jul. 17, 2013. (9 Pages).

Hong, A., et al. (Formation of Metal Nanospheres and Microspheres) Non Final Office Action for U.S. Appl. No. 13/220,816 mailed on Aug. 1, 2013. (11 Pages).

Fogel, K., et al. (Nanowires Formed by Employing Solder Nanodots) Non Final Office Action for U.S. Appl. No. 12/879,209 mailed on Aug. 27, 2013. (8 Pages).

Fogel, K., et al. (Efficient Nanoscale Solar Cell and Fabrication Method) Non Final Office Action for U.S. Appl. No. 12/852,991 mailed on Sep. 16, 2013. (25 Pages).

Fogel, K., et al. (Nanowires Formed by Employing Solder Nanodots) Final Office Action issue in U.S. Appl. No. 13/599,577 on Sep. 20, 2013. (15 Pages).

Krzyzewski, T., et al. "Ripening and Annealing Effects in INAS/GAAS (001) Quantum Dot Formation" Journal of Applied Physics, Vol. 96, No. 1. Jul. 2004. (8 Pages).

Non-Final Office Action issued in U.S. Appl. No. 12/852,991 on Dec. 27, 2013.

* cited by examiner

UNIFORMLY DISTRIBUTED SELF-ASSEMBLED SOLDER DOT FORMATION FOR HIGH EFFICIENCY SOLAR CELLS

RELATED APPLICATION INFORMATION

This application is a Continuation application of co-pending U.S. patent application Ser. No. 13/597,980 filed on Aug. 29, 2012, incorporated herein by reference in its entirety.

This application is related to commonly assigned U.S. patent application Ser. No. 12/852,991 filed on Aug. 9, 2010, commonly assigned U.S. patent application Ser. No. 12/879,209 filed on Sep. 10, 2010, commonly assigned U.S. patent application Ser. No. 13/161,163 filed on Jun. 15, 2011 and commonly assigned U.S. patent application Ser. No. 13/220,816 filed on Aug. 20, 2011, all incorporated herein by reference in their entirety.

BACKGROUND

1. Technical Field

The present invention relates to photovoltaic devices, and more particularly to photovoltaic devices and methods for improving performance using cone-shaped pillars formed by etching with uniformly distributed solder dots.

2. Description of the Related Art

Solar devices employ photovoltaic cells to generate current flow. Photons in sunlight hit a solar cell or panel and are absorbed by semiconducting materials, such as silicon. Carriers gain energy allowing them to flow through the material to produce electricity. Therefore, the solar cell converts the solar energy into a usable amount of electricity.

By increasing the effective surface area for absorption, the solar cell can be made more efficient. One way of achieving an increase in surface area includes use of a three-dimensional substrate. The three dimensional substrate may be formed by employing an etch mask created using lithography and etching pillars into the substrate. Forming an etch mask by lithography adds many steps and accrues additional cost to an already expensive process.

SUMMARY

A method for fabricating a photovoltaic device includes performing a gettering process in a processing chamber which restricts formation of a layer of gettering materials on a substrate and forming a solder layer on the substrate. The solder layer is annealed to form uniformly distributed solder dots which grow on the substrate. The substrate is etched using the solder dots to protect portions of the substrate and form cones in the substrate such that the cones provide a three-dimensional radiation absorbing structure for the photovoltaic device.

Another method for fabricating a photovoltaic device includes: placing a substrate in an evaporation chamber; closing a shutter between a gettering material source and the substrate; performing a gettering process in the processing chamber which restricts formation of a layer of the gettering material on the substrate; opening the shutter; forming a solder layer on the substrate; annealing the solder layer to form uniformly distributed solder dots which grow on a surface of the substrate; and etching the substrate using the solder dots to protect portions of the substrate and to form cones in the substrate such that the cones provide a three-dimensional radiation absorbing structure for the photovoltaic device.

Yet another method for fabricating a photovoltaic device includes: placing a substrate in an evaporation chamber; closing a shutter between a gettering material source and the substrate; performing a gettering process in the processing chamber which restricts formation of a layer of the gettering material on the substrate, the gettering process including: evaporating one or more of titanium, molybdenum and/or chromium in the processing chamber while maintaining a pressure below $5 \times 10^{-6}$ Torr for between about 180 to about 300 seconds with the shutter closed; opening the shutter; forming a solder layer on the substrate; annealing the solder layer to form uniformly distributed solder dots which grow on a surface of the substrate; and etching the substrate using the solder dots to protect portions of the substrate and to form cones in the substrate such that the cones provide a three-dimensional structure; and conformally forming at least one electrode and a diode stack on the cones to provide an active layer for providing current flow responsive to incident radiation wherein the diode stack is disposed between two electrodes and at least one electrode is transparent, the diode stack including a p-doped layer, an intrinsic layer and an n-doped layer.

A substrate for a photovoltaic device includes a textured surface formed from silicon-based material. The textured surface includes a plurality of cones uniformly distributed across the textured surface and is configured by etching from a top surface of the substrate, using a self-assembled solder dot mask evaporated on the substrate prior to etching. The cones are uniformly distributed as a result of gettering a process chamber prior to forming the solder dot mask. The cones have a height/width ratio between about 1 to about 4, and the cones have a density between $10^8$ to $10^9$ cones/cm$^2$.

Another photovoltaic device includes a substrate having a textured surface formed from silicon-based material, the textured surface including a plurality of cones uniformly distributed across the textured surface and is configured by etching from a top surface of the substrate using a self-assembled solder dot mask evaporated on the substrate prior to etching. The cones are uniformly distributed as a result of gettering a process chamber prior to forming the solder dot mask. The cones have a height/width ratio between about 1 to about 4, and the cones have a density between $10^8$ to $10^9$ cones/cm$^2$. A continuous photovoltaic stack is conformally formed over the substrate and extends over and between the plurality of cones to form a three-dimensional structure. The photovoltaic stack is configured to transduce incident radiation into current flow.

Another photovoltaic device includes a glass substrate having a textured surface including a plurality of cones uniformly distributed across the textured surface and configured by etching from a top surface of the substrate using a self-assembled solder dot mask evaporated on the substrate prior to etching. The cones are uniformly distributed as a result of gettering a process chamber prior to forming the solder dot mask. The cones have a height/width ratio between about 1 to about 4, with a height of between about 1 micron to about 4 microns and a width between 500 nanometers and 2 microns. The cones have a density between $10^8$ to $10^9$ cones/cm$^2$, the density is uniform across the substrate and is between about 1 cone per 1 micron and about 1 cone per 4 microns in all directions. A continuous photovoltaic stack is conformally formed over the textured surface of the substrate and extends over and between the plurality of cones to form a three-dimensional structure. The photovoltaic stack is configured to transduce incident radiation into current flow.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 2:
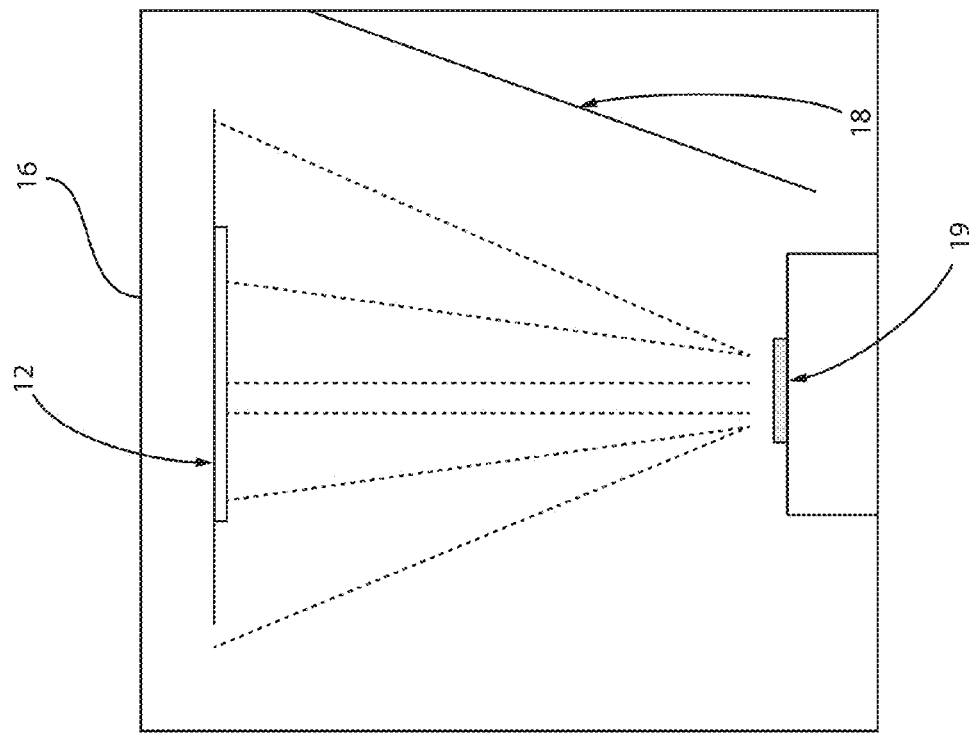
FIG. 2 is a cross-sectional view of the substrate of FIG. 1 having a solder metal layer formed thereon with the shutter opened in accordance with the present principles.

The present principles provide photovoltaic devices and methods for fabrication that have improved absorption of incident radiation. For high-efficiency silicon solar cells, a desired implementation includes three-dimensional structures which maximize absorption of a light spectrum and minimize reflection. The three-dimensional structures may be formed by etching cone-shaped pillars which form the absorbing surface. In one embodiment, cone formation may include the use of solder dots to pattern a wafer or substrate, for example, a silicon-based substrate, for etching.

Solder or nanodot patterns may be self-assembled relying on surface tension to form the dots during an anneal process. However, simply letting the solder dots form on their own leads to areas of higher and lower density concentrations of dots as well as dots of varying size. To significantly improve uniformity, the present principles provide methods to assist in more evenly spacing the later-formed solder dots and to provide more size uniformity. In this way, the spacings and sizes of the dots may be controlled to optimize manufacture and performance.

In accordance with preferred embodiments, a deposition process is employed to remove impurities inside a processing chamber so that a more homogeneous deposition of solder is possible. In one embodiment, titanium or other metal is evaporated in a chamber with a chamber shutter closed. Then, solder is deposited on the substrate and annealed resulting in a uniformly distributed matrix of solder dots. The solder dots can be controllably grown to a desired size by controlling initial solder deposition thickness.

When the solder dots are completed, three dimensional structures such as pillars or cones can be formed in the substrate. The three-dimensional structures may be employed for forming p-i-n diode layers or other layers for the formation of a photovoltaic cell or cells.

In other embodiments, multi-junction cells may be employed to achieve superior carrier collection efficiency. Multi-junction cells include two or more cells stacked on top of each other. Any radiation transmitted through a top cell has a chance of being absorbed by a lower cell.

It is to be understood that the present invention will be described in terms of a given illustrative architecture or substrate structure; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Methods as described herein may be used in the fabrication of photovoltaic devices or chips. The resulting device can be distributed by the fabricator in raw wafer form (that is, as a single wafer or substrate that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips or photovoltaic cells, ranging from toys and other low-end applications to advanced computer products having a display, a keyboard or other input device, and a central processor. The present embodiments may be part of a photovoltaic device or circuit, and the circuits as described herein may be part of a design for an integrated circuit chip, a solar cell, a light sensitive device, etc.

Figure 1:
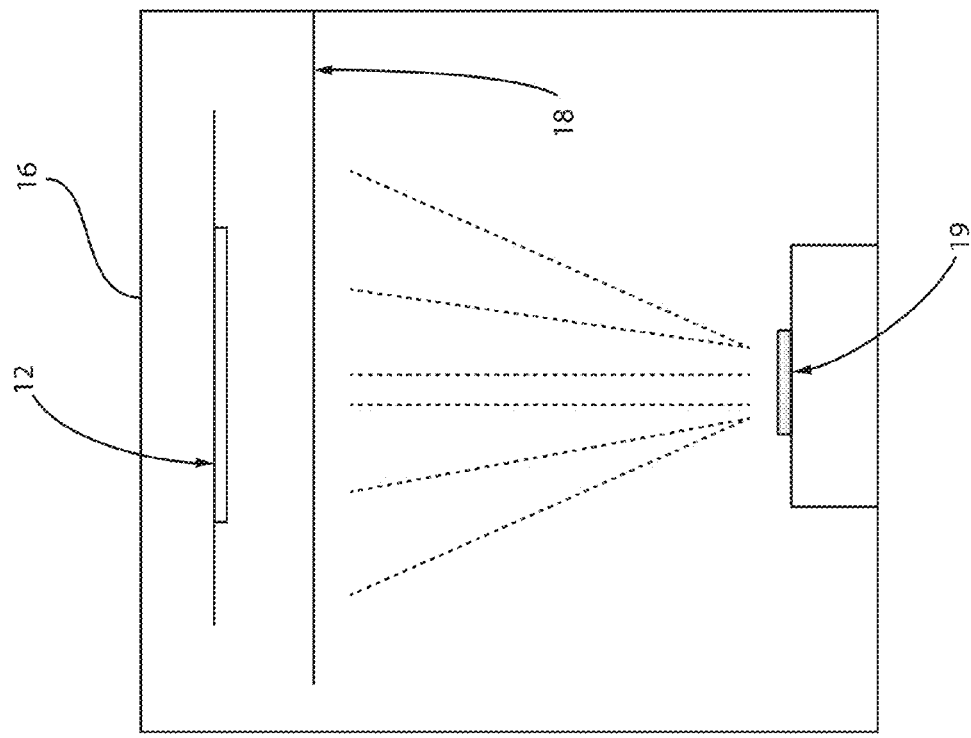
FIG. 1 is a cross-sectional view of a substrate in an evaporation chamber with a shutter closed during a gettering process in accordance with the present principles.

Referring now to the drawings in which like numerals represent the same or similar elements and initially to FIG. 1, a process for forming three-dimensional structures (e.g., cone-shaped pillars) on a substrate is illustratively shown. The present process is maskless, low cost and may be performed at low temperatures (e.g., below about 500 degrees C.). A substrate 12 may include silicon or a silicon-containing material and may include glass, quartz, single (monocrystalline) silicon, etc. While other substrate materials may be employed, silicon based materials including glass are preferred. A cleaning process may be performed on the substrate 12. The cleaning process may include a solvent, such as acetone, isopropyl alcohol (IPA), deionized water or the like alone or in combination. Other solvents may be employed as well.

A dielectric layer 14 (FIG. 3) is formed on the substrate 12. The dielectric layer 14 may include silicon oxide ($SiO_2$) on a general glass substrate or on a silicon wafer (e.g., single crystalline Si and multi-crystalline wafers). For a glass substrate, the dielectric layer 14 ($SiO_2$) may be formed to about 2 microns to 6 microns thick. The dielectric layer 14 protects against rigid impurities such as $Al_2O_3$ particles inside the glass which affect the etching processes of glass in making three dimensional structures. For Si substrates, the dielectric layer 14 ($SiO_2$) may be formed from about 50 nm to about 100 nm using Plasma Enhanced Chemical Vapor Deposition (PECVD) at a temperature range of between about 250 degree Celsius to about 400 degree Celsius. The dielectric layer 14 has been shown to enhance the dot formation on an oxide surface of the dielectric layer 14. However, the dielectric layer 14 may be omitted if a quartz substrate (12) is employed which includes pure $SiO_2$ without any other impurities.

Substrate 12 (with or without the dielectric layer 14) is placed in a processing chamber 16, e.g., an evaporation chamber. A gettering process is performed in the chamber 16 with a shutter 18 closed between a source 19 and the substrate 12. The gettering removes impurities which also results in lowering the chamber pressure. The getter metals may include titanium or other metals, e.g., molybdenum, chromium, etc.

Gettering is concerned with "clean-up" of residual gases by removing the gases from a vacuum vessel, such as the processing chamber 16. Gettering here refers to chemical gettering. A chemical getter provides a pumping action by a chemical reaction where a chemically active gas combines with a chemically active metal to form a low vapor pressure solid compound. The chemically active metal can be either an element or an alloy that, for convenience, can be called a getter metal or material, which may be employed to reduce or eliminate oxygen, nitrogen, carbon dioxide, hydrogen, hydrocarbons, etc. from the chamber 16 by forming a low vapor pressure compound such that the active gas is permanently removed from the vacuum chamber 16.

An evaporable getter may include a sublimation pump. A sublimation pump operates by heating the gettering material directly or indirectly by radiation from a filament or source 19 to cause sublimation. Once sublimed into the vapor state, the gettering material is allowed to condense on an internal array or on a portion of an inner surface of the chamber 16. As it condenses into a thin film, the gettering material becomes a pump for active gases and $H_2$.

In one embodiment, titanium is evaporated in the processing chamber 16. The processing chamber 16 includes a source crucible (or other source such as a filament) 19 that is isolated or blocked from the substrate 12 during evaporation so that no getter materials are deposited on the substrate 12, but the chamber 16 and potentially the substrate 12 are cleaned by the gettering. In this illustrative embodiment, the titanium is evaporated for 180 to 300 seconds at a chamber pressure of between $1 \times 10^{-6}$ to about $5 \times 10^{-6}$ Torr. However, chamber pressure below $1 \times 10^{-6}$ may also be employed.

The getter material evaporation is done with the evaporation shutter 18 closed so that no getter materials are deposited on the substrate 12, but the process still removes impurities inside the chamber 16 since getter materials easily react with impurities that are or include, e.g., carbon, oxygen and hydrogen.

Figure 3:
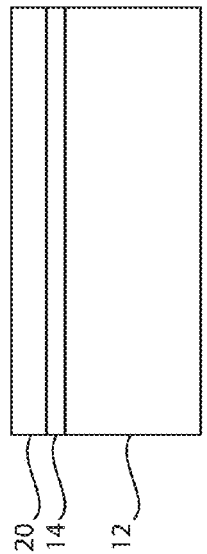
FIG. 3 is a cross-sectional view of the substrate of FIG. 2 having a solder metal layer formed on a dielectric layer in accordance with the present principles.

Referring to FIG. 2, a solder metal layer 20 (FIG. 3) is deposited over the substrate 12 or the dielectric layer 14. In the processing chamber 16, the shutter 18 is opened up to permit deposition of the solder metal layer 20 (using a different source). The solder metal layer 20 may include Sn, Pb, Sb, Bi, etc. or combinations thereof. In particularly useful embodiments, Sn solder or solders including Sn are employed. The solder metal layer 20 may include a thickness of between about 900 Angstroms to about 2400 Angstroms, and more preferably around 1200 Angstroms. The solder metal layer 20 may be formed by employing a thermal evaporation method with a deposition rate of between about 1 Angstrom per second to about 5 Angstroms per second. By controlling the thickness of the solder metal layer 20, later-formed solder dot size may be controlled. FIG. 3 illustratively shows the substrate 12 having the dielectric layer 14 and the solder metal layer 20 formed thereon.

Figure 4:
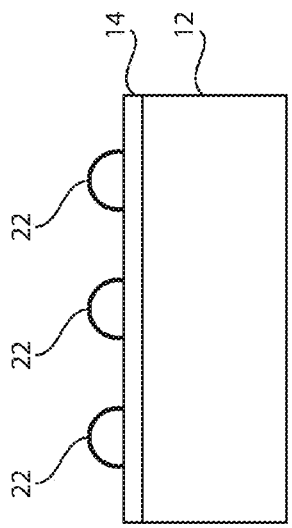
FIG. 4 is a cross-sectional view of the substrate of FIG. 3 having a solder dot pattern formed by annealing the solder metal layer in accordance with the present principles.

Referring to FIG. 4, an anneal process, such as a rapid thermal anneal (RTA), is applied to the structure such that solder metal layer 20 forms solder balls or solder dots 22. The solder balls 22 form uniformly (e.g., have a substantially uniform density) such that the dots coalesce and grow based on surface tension. The RTA may illustratively include a temperature of between 450 degrees C. to about 500 degrees C. for about 10 seconds to about one minute. The temperatures and times may vary depending on the solder material and the desired results.

Figure 5A:
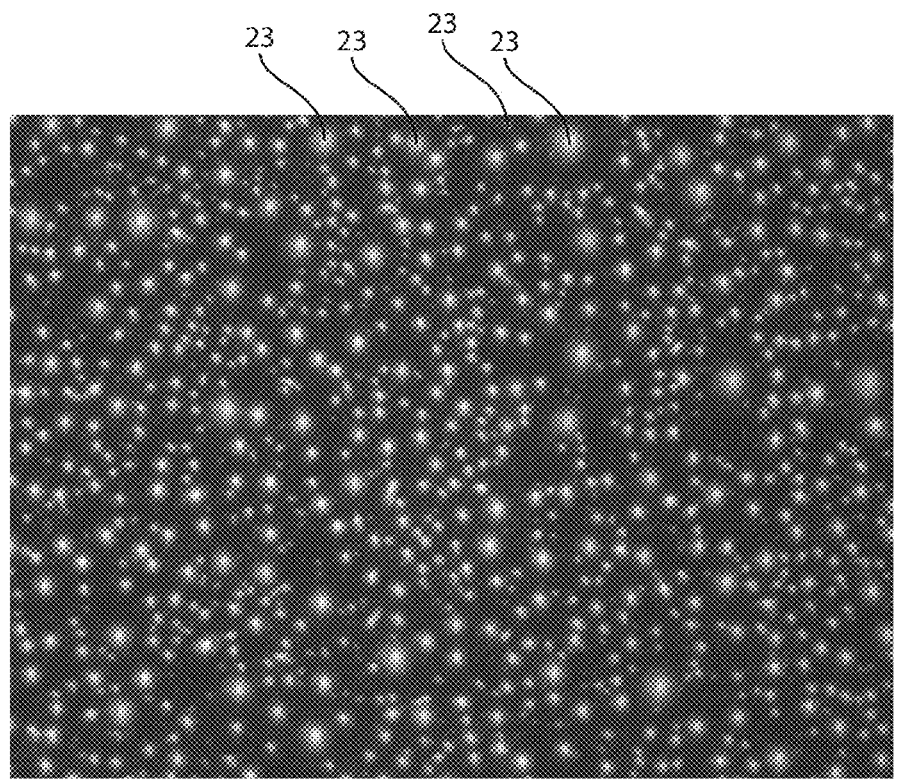
FIG. 5A is a scanning electron microscope (SEM) image showing solder dots formed using surface tension for organization.

Referring to FIG. 5A, a scanning electron microscope (SEM) image shows solder dots 23 formed without a Ti getter process before Sn deposition. These dots were formed from a Sn layer having a thickness of about 1800 Angstroms. The deposition rate was 1 Angstrom per second. The Sn layer was then annealed at 450 degrees C. for 10 seconds. While the dots 23 are dispersed across the surface of the substrate on which they are formed, there are regions of higher and lower concentration and the sizes of the dots have a wide size variation.

Figure 5B:
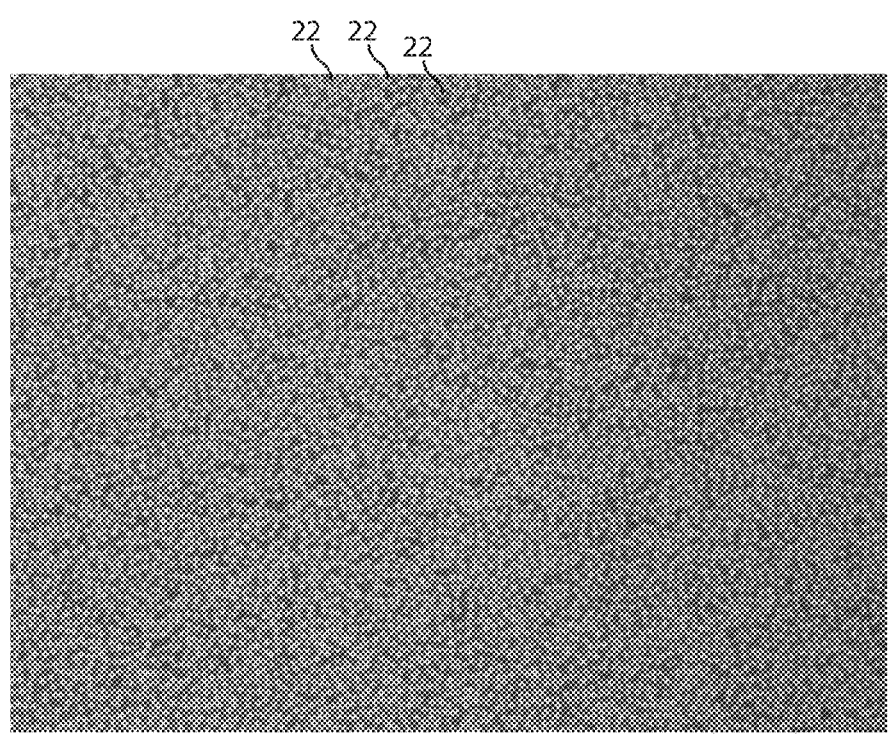
FIG. 5B is a scanning electron microscope (SEM) image showing solder dots formed after a getting process showing a well-organized, uniform density and size in accordance with the present principles.

Referring to FIG. 5B, a SEM image shows solder dots 22 formed with the Ti getter process before Sn deposition by evaporating titanium in accordance with the present principles. The dots 22 were formed from a Sn layer having a thickness of about 1800 Angstroms, as before. The deposition rate was 1 Angstrom per second. The Sn layer was then annealed at 450 degrees C. for 10 seconds. The dots 22 are significantly more uniform in density and size. Regions of different concentrations and size variations were tightly controlled in accordance with the present principles.

Figure 6:
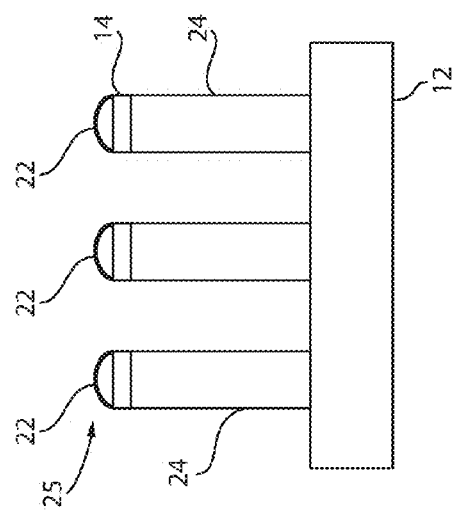
FIG. 6 is a cross-sectional view of the substrate of FIG. 4 showing the solder dot pattern acting as an etch mask for etching pillars into the substrate in accordance with the present principles.

Referring to FIG. 6, an etch process is employed to etch the substrate 12 to form three-dimensional structures (e.g., pillars or cones) 24. The etch process employs the solder balls 22 as an etch mask. For Si and/or glass dry etching, tetrafluoromethane ($CF_4$) plasma is preferably employed. Reactive ion etching parameters may include, e.g., a 30 minute etch at 300 Watts of power and at a pressure of about 100 mTorr. Etch depth may be approximately 1 to 4 microns, although other parameters and dimensions may be used and are effective.

The etch process is employed to transfer a pattern 25 of the solder dots into the substrate 12 (e.g., silicon or glass) utilizing a dry etch gas chemistry appropriate for etching substrate 12 with respect to the pattern of solder dots 22. The dry etch preferably includes a reactive ion etch (RIE) process so that the depth to width ratio is high for pillars or cones 24 formed as a result. In one embodiment, the substrate 12 includes pillars 24 having a uniform density of between about 1 cone per micron and about 1 cone per four microns in all directions from a point on the substrate 12.

Figure 7:
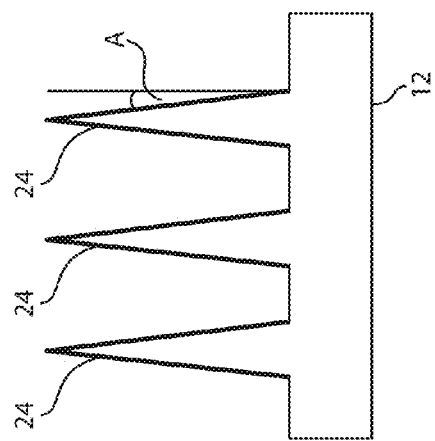
FIG. 7 is a cross-sectional view of the substrate of FIG. 6 showing pillars wet etched to form cones in the substrate in accordance with the present principles.

Referring to FIG. 7, the solder metal layer 20 is preferably removed during dry etching. If the solder metal layer 20 is not completely removed, a wet etch may be performed to completely remove the solder metal layer 20, to remove the remaining portions of the dielectric layer 14 and to further etch the pillars into cones 24. The wet etching process further tapers the pillars/cones 24. As a result of etching with the solder dot mask pattern 25, the substrate 12 includes a textured surface with cones 24 having a height between 1 to 4 microns and a width of between 500 nm and 2 microns. A height/width ratio of the cones may be between about 1 to about 4. A surface density of the cones 24 may be between about $10^8$ to $10^9$ cones/cm$^2$, and a side angle (A) from vertical may be in the range of between about 45 and about 80 degrees. The wet etching process may include a dilute hydrofluoric (HF) etch, e.g., HF:H$_2$O=1:50 for 10-20 minutes for a glass substrate, or a nitric acid (HNO$_3$) and HF etch for Si substrates.

Figure 8A:
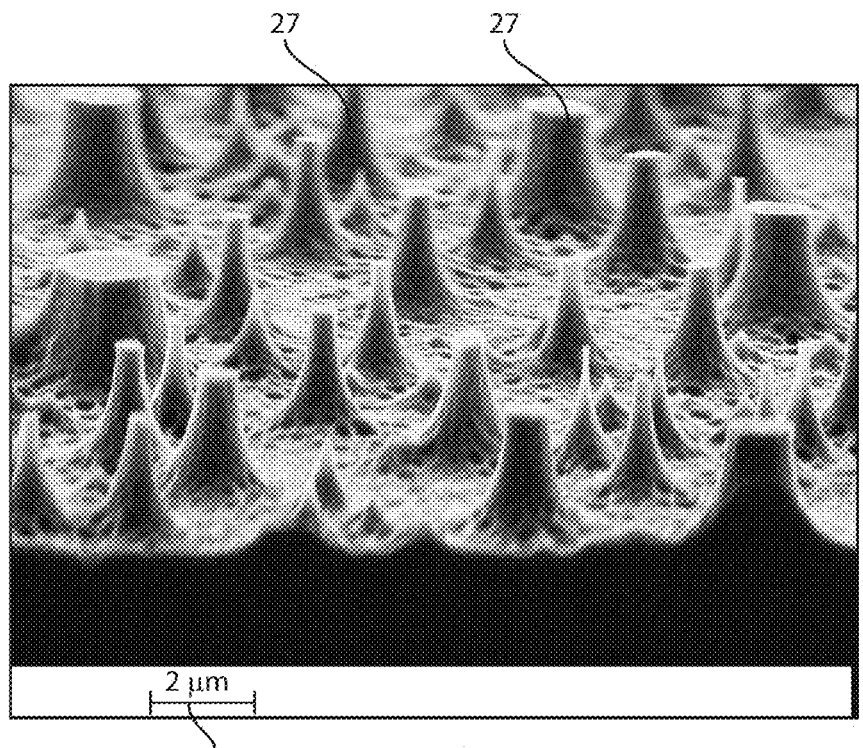
FIG. 8A is a scanning electron microscope (SEM) image showing cones formed using the surface tension formed mask of FIG. 5A.
Figure 8B:
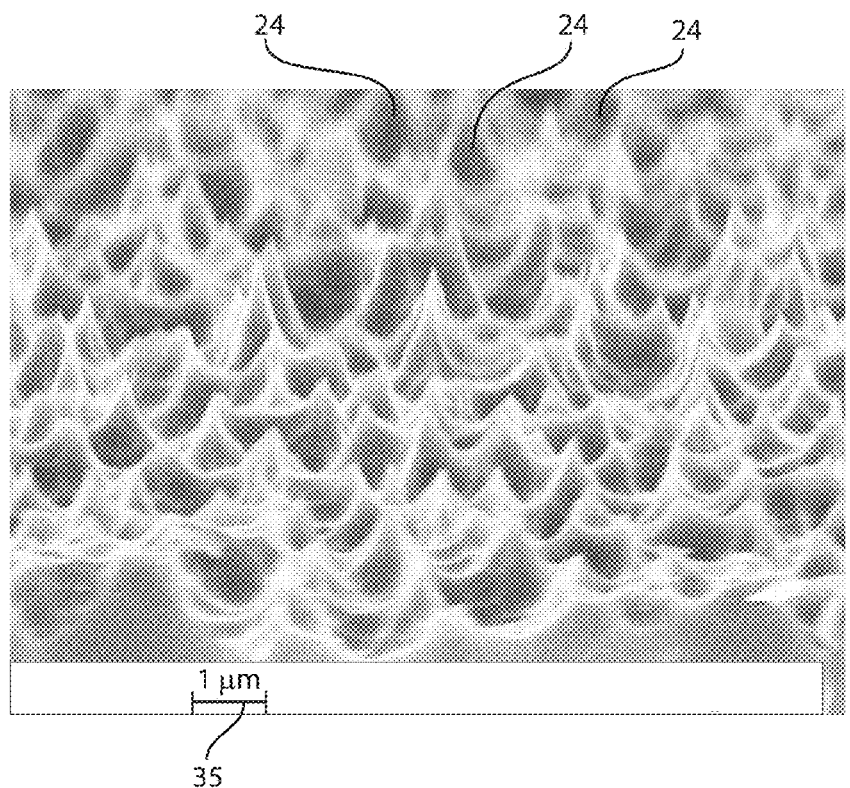
FIG. 8B is a scanning electron microscope (SEM) image showing cones formed using the solder dot pattern formed after the gettering process from FIG. 5B, the cones being well-organized and of uniform density in accordance with the present principles.

Referring to FIGS. 8A and 8B, SEM images of etched glass substrates are shown for comparison. FIG. 8A shows pillars/cones 27 formed using the etch mask of solder dots 23 in FIG. 5A. FIG. 8B shows pillars/cones 24 formed using the etch mask of solder dots 22 in FIG. 5B. The uniform and dense pattern provided in FIG. 8B yields a uniform dot array which reduces the possibility of short circuiting the solar cell and increases the solar cell efficiency by providing higher collection efficiency. FIG. 8A includes a 2 micron scale 33, and FIG. 8B includes a scale 35 of one micron.

The structure of FIG. 7 may be employed in a silicon-based solar cell. In one embodiment, the structure of FIG. 7 is employed to form a p-i-n stack structure thereon for a photovoltaic device. The cones 24 assist in increasing the surface area of absorption and provide for radiation trapping therebetween. The cones 24 with larger than 1:2 (width to height) aspect ratio are preferred for enhanced light absorption.

Figure 9A:
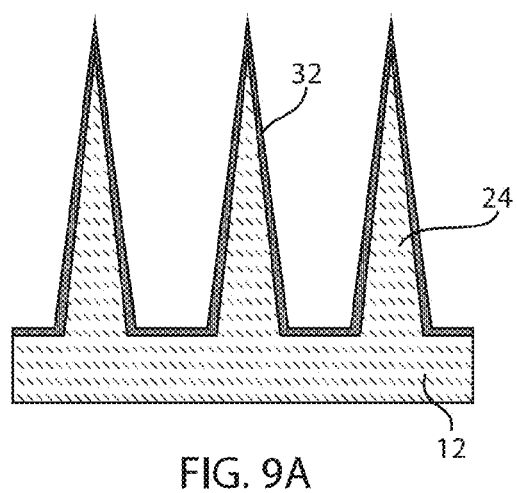
FIG. 9A is a cross-sectional view of the substrate of FIG. 7 showing an electrode layer formed on the pillars/cones in accordance with the present principles.
Figure 9B:
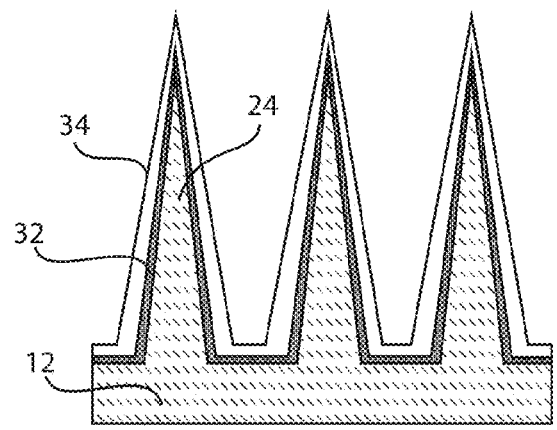
FIG. 9B is a cross-sectional view of the substrate of FIG. 9A showing a pin diode stack formed on the electrode layer in accordance with the present principles.
Figure 9C:
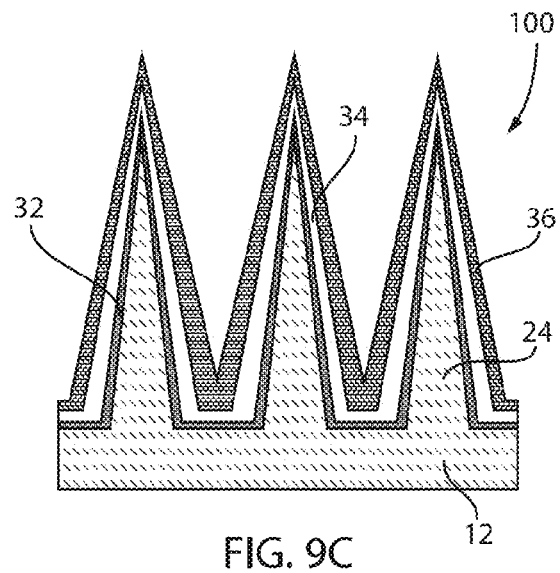
FIG. 9C is a cross-sectional view of the substrate of FIG. 9B showing another electrode formed on the pin stack in accordance with the present principles.

Referring to FIGS. 9A-9C and in particular to FIG. 9A, a process of forming an amorphous silicon solar cell is illustratively shown in accordance with one embodiment. It should be understood that the substrate 12 employed in this process includes a transparent material, such as glass; however, silicon or other substrate materials may be employed. In the present case, the substrate 12 has been processed in a same manner as described with respect to FIGS. 1-7.

A first electrode layer 32 is formed on cone 24 by a deposition process. The first electrode layer 32 may include a transparent conductive material such as a transparent conductive oxide (e.g., zinc oxide, indium tin oxide, indium zinc oxide, etc.), ultra-thin metal (e.g., 20 nm or less in thickness) or other conductive structure. The deposition process may include a chemical vapor deposition process or other suitable deposition process.

Referring to FIG. 9B, a p-i-n diode stack 34 is formed over the first electrode 32. The stack 34 preferably includes a first doped layer (p-doped layer), and intrinsic layer (i-layer) and a second doped layer (n-doped layer). The polarity of the doped layers may be reversed. The stack 34 may be formed using a CVD or PECVD process. The stack 34 provides active areas for absorbing radiation and converting the radiation into charge flow as is known in the art. A plurality of different materials may be selected for the layers in stack 34. In one particularly useful embodiment, the first and second doped layers may include doped polycrystalline/microcrystalline silicon, and the intrinsic layer may include undoped amorphous silicon. The layers of the stack 34 may include monocrystalline silicon, multi-crystalline silicon (MC-Si), single crystalline silicon (SC-Si), amorphous silicon (a-Si), polycrystalline silicon (polysilicon), etc. Other materials are also contemplated.

Referring to FIG. 9C, a second electrode 36 is formed on the stack 34 to provide a photovoltaic cell 100. The second electrode 36 may include a transparent conductive material such as a transparent conductive oxide (e.g., zinc oxide, indium tin oxide, indium zinc oxide, etc.), ultra-thin metal (e.g., 20 nm or less in thickness) or other conductive structure. The deposition process may include a CVD, PECVD or other suitable deposition process.

The cones 24 assist in increasing the surface area of absorption and provide for radiation trapping between the cones 24. The structures depicted in FIGS. 9A-9C may be constructed to receive light with the cones 30 facing out (e.g., toward the light) or facing in. The cones 24 increase the surface area and therefore the collection efficiency in any incident light direction as compared with, e.g., a flat surface cell.

Figure 10:
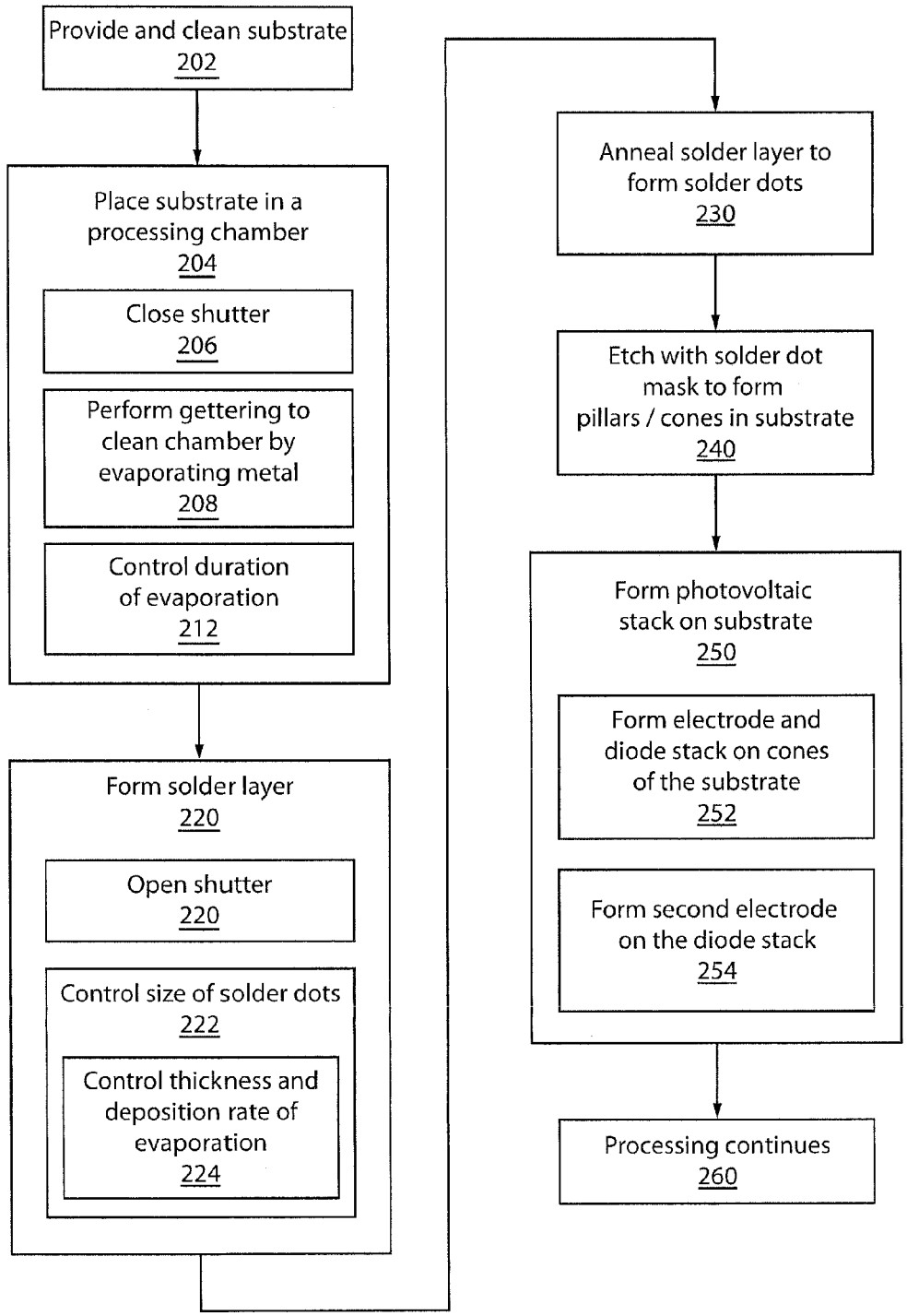
FIG. 10 is a block/flow diagram of a method for fabricating a photovoltaic device in accordance with illustrative embodiments.

Referring to FIG. 10, a method for fabricating a photovoltaic device is illustratively depicted in accordance with particularly useful embodiments. It should be noted that, in some alternative implementations, the functions noted in the blocks may occur out of the order noted in FIG. 10. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 202, a substrate is provided and cleaned by known cleaning methods. The substrate may include materials such as, e.g., single crystalline silicon, multi-crystalline silicon, amorphous silicon, glass, quartz or other etchable materials. Depending on the material, a dielectric layer may be formed on the substrate or as part of the substrate.

In block 204, the substrate is placed in a processing (evaporation) chamber. In block 206, a shutter in the evaporation chamber is closed between a source and the substrate. In block 208, a gettering process is performed by evaporating a metal in the evaporation chamber. The metal may include titanium although other metals may be employed (e.g., molybdenum, chromium, etc.). A layer of the metal material should not be formed on the substrate (or dielectric layer). The metal is instead employed to clean the chamber and potentially the substrate. In block 212, evaporating the metal includes controlling duration of the evaporation. This includes evaporating the metal for between about 180 to about 300 seconds with the chamber pressure up to $5 \times 10^{-6}$ Torr or below.

In block 220, a solder layer is formed on the substrate. The solder layer may include one of more of Sn, Pb, Sb, Bi or alloys thereof. This is performed in a same evaporation chamber as the gettering after the shutter is opened in block 221. A CVD or other process may be employed to deposit the solder layer. In block 222, the solder layer is formed to control a size of the solder dots by controlling a thickness of the solder layer. In block 224, the solder layer may be deposited at a deposition rate of between about 1 and about 5 Angstroms per second to a thickness of between about 900 to 2400 Angstroms in thickness. The process is well-controlled to accurately provide a solder metal layer thickness that translates to a size of the solder dots.

In block 230, the solder layer is annealed to form uniformly distributed solder dots. The anneal process may include a rapid thermal anneal at between about 450 to about 500 degrees for between about 5 to about 60 seconds.

In block 240, the substrate is etched using the solder dots to protect portions of the substrate to form cones in the substrate such that the cones provide a three-dimensional structure to enhance radiation absorbing effects for the photovoltaic device. The etching process may include a dry etch (e.g., RIE) which forms pillars followed by a wet etch to form the pillars into cones.

In block 250, a photovoltaic stack and electrodes are formed on the cones of the substrate. In block 252, an electrode and a diode stack are formed on the cones to provide an active layer for providing current flow responsive to incident radiation. In block 254, a second electrode is formed on the diode stack. The diode stack is disposed between the two electrodes. At least one electrode is transparent, and the diode stack may include a p-doped layer, an intrinsic layer and an n-doped layer. In block 260, processing continues to complete the photovoltaic cell. This may include forming additional layers or components as needed.

Having described preferred embodiments of a device and method for uniformly distributed self-assembled solder dot formation for high efficiency solar cells (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A photovoltaic device, comprising: a substrate having a textured surface comprised of a silicon-based material, the textured surface including:
    a plurality of cones uniformly distributed across the textured surface; and the plurality of cones being uniformly distributed and configured by etching from a top surface of the substrate using a self-assembled solder dot mask evaporated on the substrate prior to etching, the plurality of cones being uniformly distributed as a result of gettering a process chamber prior to forming the solder dot mask, the plurality of cones having a height/width ratio between about 1 to about 4, wherein the plurality of cones have a uniform density of between 1 cone per 1.1 micron and 1 cone per 4 microns in all directions; and
    a continuous photovoltaic stack conformally formed over the substrate and extending over and between the plurality of cones to form a three-dimensional structure, the continuous photovoltaic stack comprising doped layers of polycrystalline silicon or microcrystalline silicon and an intrinsic layer of amorphous silicon, the continuous photovoltaic stack being configured to transduce incident radiation into current flow.

2. The device as recited in claim 1, wherein the substrate includes glass.

3. The device as recited in claim 1, wherein each cone of the plurality of cones form a side angle from vertical in a range of between about 45 and about 80 degrees.

4. The device as recited in claim 1, wherein each cone of the plurality of cones includes a height between about 1 micron to about 4 microns.

5. The device as recited in claim 1, wherein each cone of the plurality of cones includes a width between 500 nanometers and 2 microns.

6. The device as recited in claim 1, further comprising at least one conductive layer deposited on the substrate that uniformly covers sides of the plurality of cones and spaces between the cones, the continuous photovoltaic stack being formed on the conductive layer.

7. The device as recited in claim 6, further comprising an electrode formed on the continuous photovoltaic stack.

8. The device as recited in claim 1, wherein the continuous photovoltaic stack includes a p-type layer, an n-type layer and an intrinsic layer disposed therebetween.

9. A photovoltaic device, comprising:
    a glass substrate having a textured surface including a plurality of cones uniformly distributed across the textured surface and configured by etching from a top surface of the substrate using a self-assembled solder dot mask evaporated on the substrate prior to etching, the plurality of cones being uniformly distributed as a result of gettering a process chamber prior to forming the solder dot mask,
    each cone of the plurality of cones having a height/width ratio between about 1 to about 4, with a height of between about 1 micron to about 4 microns and a width between 500 nanometers and 2 microns, the plurality of cones having a density being uniform across the substrate and being between 1 cone per 1.1 micron and 1 cone per 4 microns in all directions; and
    a continuous photovoltaic stack conformally formed over the textured surface of the substrate and extending over and between the plurality of cones to form a three-dimensional structure, the continuous photovoltaic stack being configured to transduce incident radiation into current flow.

10. The device as recited in claim 9, wherein the plurality of cones form a side angle from vertical in a range of between about 45 and about 80 degrees.

11. The device as recited in claim 9, further comprising at least one conductive layer deposited on the substrate that uniformly covers sides of the plurality of cones and space between the plurality of cones, the continuous photovoltaic stack being formed on the conductive layer.

12. The device as recited in claim 11, further comprising an electrode formed on the continuous photovoltaic stack.

13. The device as recited in claim 9, wherein the continuous photovoltaic stack includes a p-type layer, an n-type layer and an intrinsic layer disposed therebetween.

14. The device as recited in claim 9, wherein the continuous photovoltaic stack includes at least one of amorphous silicon, micro-crystalline silicon and silicon carbide.

* * * * *